(12) United States Patent
Kimura et al.

(10) Patent No.: US 9,142,494 B2
(45) Date of Patent: *Sep. 22, 2015

(54) SEMICONDUCTOR DEVICE AND METHOD FOR MANUFACTURING THE SAME

(71) Applicant: ROHM CO., LTD., Kyoto-shi, Kyoto (JP)

(72) Inventors: Akihiro Kimura, Kyoto (JP); Tsunemori Yamaguchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/300,667

(22) Filed: Jun. 10, 2014

(65) Prior Publication Data

US 2014/0284782 A1   Sep. 25, 2014

Related U.S. Application Data

(63) Continuation of application No. 13/522,853, filed as application No. PCT/JP2011/050637 on Jan. 17, 2011, now Pat. No. 8,779,569.

(30) Foreign Application Priority Data

Jan. 18, 2010 (JP) .................................. 2010-008183

(51) Int. Cl.
*H01L 23/495* (2006.01)
*H01L 23/31* (2006.01)
*H01L 23/00* (2006.01)

(52) U.S. Cl.
CPC ...... *H01L 23/49541* (2013.01); *H01L 23/3107* (2013.01); *H01L 23/49503* (2013.01); *H01L 23/49513* (2013.01); *H01L 23/49551* (2013.01); *H01L 24/32* (2013.01); *H01L 23/3135* (2013.01); *H01L 24/48* (2013.01); *H01L 24/49* (2013.01); *H01L 2224/32245* (2013.01); *H01L 2224/48091* (2013.01); *H01L 2224/48247* (2013.01); *H01L 2224/49171* (2013.01);
(Continued)

(58) Field of Classification Search
USPC ................... 257/666–677, 782–784, E23.04, 257/E23.127
See application file for complete search history.

(56) References Cited

U.S. PATENT DOCUMENTS

| 6,849,950 B1 | 2/2005 | Matsuura |
| 7,187,075 B1 | 3/2007 | Hwa et al. |
| 8,421,197 B2 | 4/2013 | Do et al. |
| 8,779,569 B2 * | 7/2014 | Kimura et al. ............... 257/676 |

FOREIGN PATENT DOCUMENTS

| JP | 64-1266 | 1/1989 |
| JP | 3-44040 | 2/1991 |

(Continued)

*Primary Examiner* — Jasmine Clark
(74) *Attorney, Agent, or Firm* — Hamre, Schumann, Mueller & Larson, P.C.

(57) ABSTRACT

A semiconductor device 100 includes a first insulating material 110 attached to a second main surface 106*b* of a semiconductor chip 106, and a second insulating material 112 attached to side surfaces of the semiconductor chip 106, the first insulating material 110 and an island 102. The semiconductor chip 106 is fixed to the island 102 via the first insulating material 110 and the second insulating material 112. The first insulating material 110 ensures a high dielectric strength between the semiconductor chip 106 and the island 102. Though the second insulating material 112 having a modulus of elasticity greater than that of the first insulating material 110, the semiconductor chip 106 is firmly attached to the island 102.

31 Claims, 16 Drawing Sheets

(52) U.S. Cl.
CPC ............. *H01L2224/73265* (2013.01); *H01L 2924/01004* (2013.01); *H01L 2924/01005* (2013.01); *H01L 2924/01013* (2013.01); *H01L 2924/01023* (2013.01); *H01L 2924/01029* (2013.01); *H01L 2924/0132* (2013.01); *H01L 2924/0133* (2013.01); *H01L 2924/01033* (2013.01); *H01L 2924/01047* (2013.01); *H01L 2924/01078* (2013.01); *H01L 2924/01079* (2013.01); *H01L 2924/01082* (2013.01); *H01L 2924/01322* (2013.01); *H01L 2924/07802* (2013.01); *H01L 2924/19041* (2013.01)

(56) References Cited

FOREIGN PATENT DOCUMENTS

| | | |
|---|---|---|
| JP | 4-726 | 1/1992 |
| JP | 5-343596 | 12/1993 |
| JP | 7-221125 | 8/1995 |
| JP | 8-83875 | 3/1996 |
| JP | 11-3899 | 1/1999 |
| JP | 2001-15531 | 1/2001 |
| JP | 2010-10634 | 1/2010 |

\* cited by examiner

SEMICONDUCTOR DEVICE AND METHOD FOR MANUFACTURING THE SAME

This application is a Continuation of U.S. Ser. No. 13/522,853, filed Jul. 18, 2012, which is a National Stage Application of PCT/JP2011/050637, filed Jan. 17, 2011, which applications are incorporated herein by reference.

TECHNICAL FIELD

The present invention relates to a semiconductor device and a method for manufacturing the same.

It is known that a semiconductor device can be configured to include a semiconductor chip that is mounted onto an island of a lead frame and covered with a molding resin. Such a semiconductor device is manufactured through a die bonding process in which a diced semiconductor chip is fixed to the island using e.g. an adhesive.

For the die bonding process, different kinds of adhesives are used depending on whether the island and the semiconductor chip are to be electrically connected or to be electrically insulated.

Specifically, when the island and the semiconductor chip are to be electrically connected, the following methods may be used for bonding the island and the chip. A silver paste is applied to a sliver-plated island, and the semiconductor chip is pressed lightly there. Alternatively, a small piece of gold tape is placed between a gold-plated island and a semiconductor chip, so that an eutectic of gold and silicon is formed.

When an island and a semiconductor chip are to be insulated, an insulating paste made of a resin such as an acrylic or epoxy-based resin is applied to the island, and a semiconductor chip is pressed lightly there. Alternatively, the semiconductor chip is adhered to the island using an insulating film such as a DAF (Die Attach Film). There are some types of packages whereby islands are exposed to the outside, such as MAP (Mold Array Package) and QFN (Quad Flat Non-leaded) package. By using such an package, together with the insulation between the island and the semiconductor chip, it is possible to prevent current from leaking to an external substrate, and to ensure high heat dissipation.

Further, the insulation between the island and semiconductor chips makes it possible to mount a plurality of chips, such as level shifter ICs and power supply ICs, on the same island even when different potentials are to be applied to the back electrodes of the respective chips. Examples of conventionally used methods for mounting a plurality of chips on the same island include: (1) a method in which a plurality of chips are mounted on the same surface of the island; and (2) a method in which some chips are mounted on a first main surface and the others on a second main surface of the island.

However, there are some drawbacks to the method using an insulating paste for providing insulation between the island and the semiconductor chip. For instance, the semiconductor chip may unduly slant during the die bonding, or voids may be generated in the insulating paste, thereby lowering the electrical insulating strength between the island and the semiconductor chip.

With the methods using an insulating film, on the other hand, it is necessary to prepare an additional device for a DAF. Further, chippings generated by the dicing of semiconductor chips may be attached to the insulating film, thereby lowering the electrical insulating strength between the island and the semiconductor chip.

To address the above-described problems, Patent Document 1 discloses a technical means using both an insulating paste and an insulating film for adhering the semiconductor chip to the island.

FIG. 23 shows a semiconductor device depicted in FIG. 2 of Patent Document 1. The semiconductor device 900 includes a semiconductor chip 902, an insulating film 904, an insulating adhesive 906, and an island 908.

In the above configuration, the insulating film 904 is interposed between the semiconductor chip 902 and the island 908. Thus, the electrical insulating strength between the semiconductor chip 902 and the island 908 can be maintained at a predetermined level or higher even if voids are generated in the insulating adhesive 906.

PRIOR ART DOCUMENT

Patent Document

Patent Document 1: JP-H04-726

DISCLOSURE OF THE INVENTION

Problem to be Solved by the Invention

In the semiconductor device 900 shown in FIG. 23, however, the modulus of elasticity of the insulating film 904 at room temperature is 3000 MPa or so. Thus, the energy applied for pressure-bonding the wires onto the semiconductor chip 902 will be unduly absorbed by the insulating film 904. This has contributed to quality loss. Furthermore, the present inventors have found that an reduction in size of the semiconductor chip 902 mounted onto the island 908 leads to an increase in the rate of occurrence of the problem noted above.

Means for Solving Problem

The present invention has been proposed to overcome the above problems. It is therefore an object of the present invention to provide a semiconductor device in which a semiconductor chip is attached to an island more firmly, so that a high dielectric strength is ensured between the semiconductor chip and the island, and that wire bonding can be performed with high precision. Another object of the present invention is to provide a method for manufacturing such semiconductor devices.

According to a first aspect of the present invention, there is provided a semiconductor device that includes: an island; a first insulating material; a second insulating material higher in modulus of elasticity than the first insulating material; and a semiconductor chip including a first main surface and a second main surface opposite to the first main surface, where the first main surface is provided with a bonding pad, and the second main surface is attached to the island via the first insulating material and the second insulating material. The second insulating material is held in contact with both the island and the semiconductor chip.

Preferably, the first insulating material is provided on the island, and the second insulating material is held in contact with and fixed to: the second main surface; side surfaces connected to both the first main surface and the second main surface; the first insulating material; and the island.

Preferably, the first insulating material is disposed outwardly beyond all outer sides of the second main surface.

Preferably, the first insulating material is covered with the second insulating material.

Preferably, the second insulating material comprises an insulating paste.

Preferably, the second insulating material has a modulus of elasticity not smaller than 3000 MPa and not greater than 10000 MPa.

Preferably, the first insulating material has a modulus of elasticity not smaller than 1000 MPa and not greater than 5000 MPa.

Preferably, a part of the island is exposed to an outside of the semiconductor device.

Preferably, the island is supported by a suspending lead.

Preferably, the semiconductor device of the first aspect further includes a third insulating material attached to the second main surface.

Preferably, the first insulating material has a volume resistivity not smaller than 1000 GΩ·cm.

Preferably, the first insulating material is fixed to the island so as not to be disposed outwardly beyond outer sides of the second main surface.

Preferably, the second main surface is quadrilateral, and the first insulating material is attached to the island so as not to be disposed outwardly beyond two opposite sides of the second main surface.

Preferably, the first insulating material is formed into a cross intersecting at a portion on the island facing a center of the second main surface, and the first insulating material is fixed to the island.

Preferably, the first insulating material comprises a plurality of pieces separate from each other and disposed in a region of the island facing the second main surface.

Preferably, the first insulating material is formed with a though-hole extending to the island.

Preferably, the first insulating material covers the second main surface, and the second insulating material is held in contact with and fixed to: side surfaces connected to the first main surface and the second main surface; the first insulating material; and the island.

Preferably, the first insulating material is covered with the second insulating material.

Preferably, the second insulating material has a modulus of elasticity not smaller than 3000 MPa and not greater than 10000 MPa.

Preferably, the second insulating material comprises an insulating paste.

Preferably, the semiconductor device of the first aspect is further provided with a plated layer that includes an outer edge portion formed in a region of the island that surrounds a region with which the second insulating material is held in contact, and the outer edge portion reaches at least a part of outer sides of the island.

Preferably, the outer edge portion is formed in a frame reaching all the outer sides of the island.

Preferably, the island is formed in a rectangle, and the outer edge portion includes parts that are held in contact with four corners of the island, respectively, and spaced apart between the corners.

Preferably, the semiconductor device of the first aspect further includes a suspending lead supporting the island, and the plated layer further includes a suspending lead portion formed on the suspending lead.

Preferably, the plated layer is made of Ag.

Preferably, the semiconductor device of the first aspect further includes an input lead, an output lead and a ground lead that are connected to the semiconductor chip, and the semiconductor chip is so configured that the output lead provides a negative potential with respect a ground potential when a positive potential is applied to the input lead with the ground lead connected to the ground potential.

Preferably, the semiconductor device of the first aspect further includes a negative voltage generating unit for generating a negative voltage with respect to a reference potential.

Preferably, the semiconductor device of the first aspect is constituted as a system power source for generating a plurality of positive voltages with respect to the reference potential.

According to a second aspect of the present invention, there is provided a method for manufacturing a semiconductor device, the method includes: forming elements and bonding pads on a first main surface of a semiconductor wafer; attaching a first insulating material to a second main surface of the semiconductor wafer opposite to the first main surface; dicing the semiconductor wafer into separate semiconductor chips; attaching each of the semiconductor chips to an island of a lead frame via a second insulating material; bonding wires to the bonding pads and inner leads of the lead frame; and molding each of the semiconductor chips and the lead frame.

Preferably, the first insulating material is applied to the second main surface of the semiconductor wafer by spin coating.

DESCRIPTION OF THE INVENTION

<First Embodiment>

Figure 1:
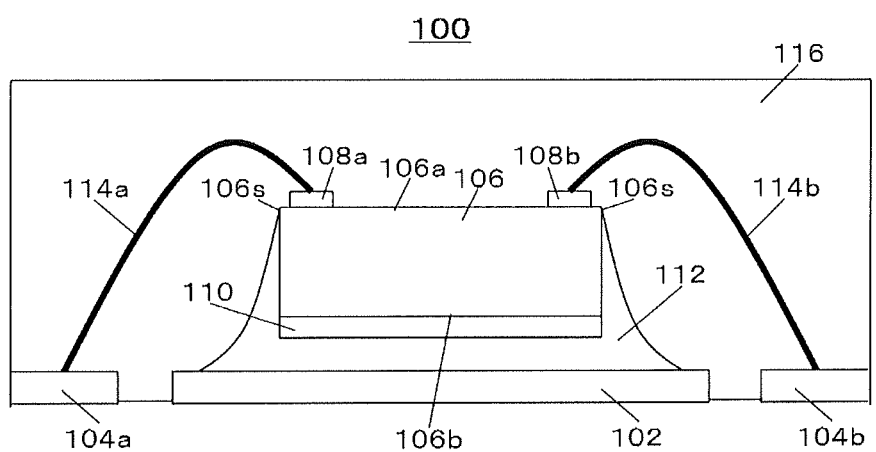
FIG. 1 is a schematic cross-sectional view showing a semiconductor device according to a first embodiment of the present invention.

FIG. 1 shows a semiconductor device according to a first embodiment of the present invention. A semiconductor device 100 includes an island 102, leads 104a and 104b, a semiconductor chip 106, bonding pads 108a and 108b, a first insulating material 110, a second insulating material 112, bonding wires 114a and 114b, and a molding resin 116.

The island 102 is a so-called die pad portion for mounting the semiconductor chip 106 by a die bonding process. Ordinarily, the same material as that of the leads 104a and 104b can be used for the island 102. Cu—Fe—P, which is a Cu-based material, a Fe 58%-Ni 42% alloy, which is a Fe-based material, or the like can be used as the material of the island 102 and the leads 104a and 104b. The lower surface of the island 102 is exposed so as to be mounted on an external substrate (not shown) for the purpose of increasing the heat dissipation.

The leads 104a and 104b are electrically connected to the bonding pads 108a and 108b, and are used as connection terminals for connection to an external substrate. Although FIG. 1 shows a so-called QFN configuration, in which there is no outer lead, the present invention is not limited to QFN, and is applicable to various package configurations, including, for example, SOP (Small Outline Package), SOJ (Small Outline J-leaded), QFP (Quad Flat Package), LCC (Leaded Chip Carrier), BGA (Ball Grid Array), LGA (Land Grid Array), TCP (Tape Carrier Package), CSP (Chip Size Package), and MAP (Mold Array Package).

Though not shown in FIG. 1, the island 102 is supported by suspending leads. In a region between one and another suspending leads, a plurality of inner leads are provided at predetermined intervals.

The bonding pads 108a and 108b are formed on a first main surface 106a of the semiconductor chip 106. An integrated circuit constituted by elements such as transistors, diodes, and resistors is formed inside the semiconductor chip 106. The first insulating material 110 is adhered to a second main surface 106b opposing the island 102.

The bonding pads 108a and 108b are connected to the integrated circuit formed inside the semiconductor chip 106, and are connected to the leads 104a and 104b with the bonding wires 114a and 114b. Al, Cu, or the like can be used as the material of the bonding pads 108a and 108b, whereas Au, Cu, Al, or the like can be used as the material of the bonding wires 114a and 114b.

The semiconductor chip 106 is adhered onto the island 102 with the first insulating material 110 and the second insulating material 112. In the first embodiment, polyamide imide, polyimide, alumina, ceramics, or the like can be used as the first insulating material 110. The first insulating material 110 may be bonded, as an insulating film, to the second main surface 106b of a semiconductor wafer before being subjected to dicing, or in other words, the surface on which the bonding pads 108a and 108b have not been formed, or may be applied to the second main surface 106b of the semiconductor wafer through spin coating of a liquid resin. In the case of applying the first insulating material 110 by spin coating, a back coating resin commonly used for CSP can be used as the first insulating material 110.

The first insulating material 110 is adhered to the second main surface 106b of the semiconductor chip 106 through bonding or spin coating of an insulating film. For this reason, it is less likely that voids are generated inside the first insulating material 110 as compared to the case where a so-called insulating paste is used. Therefore, it is possible to enhance the insulation performance. For example, in the case of using a polyimide-based resin, it is possible to obtain a withstand voltage of about 800 V with a thickness of 20 μm. Although the thickness of the first insulating material 110 may be appropriately adjusted according to the required withstand voltage, it is desirable that the thickness of first insulating material 110 is 5 μm or more and 50 μm or less, in order to obtain a high withstand voltage without increasing the overall size of the semiconductor device. More preferably, it is desirable that the thickness of the first insulating material 110 is 10 μm or more and 25 μm or less.

Also, it is desirable that the first insulating material 110 has a modulus of elasticity at room temperature of 1000 MPa or more and 5000 MPa or less, in order to prevent cracking in the second main surface 106b of the semiconductor chip 106 caused by thermal stress, while maintaining a high withstand voltage and high adhesion. The modulus of elasticity of the first insulating material 110 can be adjusted by adjusting, for example, the drying temperature and the drying time of the insulating material. Furthermore, it is desirable that first insulating material 110 has a volume resistivity of 1000 GΩ·cm or more, in order to ensure the withstand voltage between the semiconductor chip 106 and the island 102.

In the first embodiment, an acrylic resin, a silicon-based resin, an epoxy-based resin, a polyimide-based resin, or the like can be used as the second insulating material 112. The second insulating material 112 provides a bond between the semiconductor chip 106 and the island 102 as an insulating paste.

The semiconductor chip 106 in which the first insulating material 110 is adhered to the second main surface 106b is bonded, by a die bonder, onto the paste-like second insulating material 112 applied onto the island 102. At this time, even if the semiconductor chip 106 is inclined, the first insulating material 110 is always interposed between the semiconductor chip 106 and the island 102 because the first insulating material 110 is adhered to the second main surface 106b of the semiconductor chip 106. This can ensure the withstand voltage between the semiconductor chip 106 and the island 102.

Because the second insulating material 112 is in the form of a paste during die bonding, there is the possibility that a void may be created thereinside. However, the first insulating material 110 adhered to the second main surface 106b of the semiconductor chip 106 can prevent such void from extending to the semiconductor chip 106. Therefore, the withstand voltage between the semiconductor chip 106 and the island 102 can be ensured even if a void is generated in the second insulating material 112.

It is desirable that the modulus of elasticity of the second insulating material 112 at room temperature is 3000 MPa or more and 10000 MPa or less, in order to prevent cracking of the second insulating material 112, while ensuring high adhesion. If the modulus of elasticity is less than 3000 MPa, the adhesive strength is reduced. If the modulus of elasticity exceeds 10000 MPa, cracks tend to be generated. The second insulating material 112 needs to have a high modulus of elasticity in order to firmly adhere the semiconductor chip 106 to the island 102. In contrast, it is desirable to use, as the first insulating material 110, a material having a relatively low modulus of elasticity as compared to that of the second insulating material 112 in order to reduce the thermal stress applied onto the second main surface 106b of the semiconductor chip 106. The second insulating material 112 is subjected to a heat curing treatment in a state in which it is in contact with the island 102, the first insulating material 110, and side surfaces of the semiconductor chip 106, and, therefore, the semiconductor chip 106 can be firmly adhered to the island 102. The modulus of elasticity of the second insulating material 112 can be adjusted by changing the drying temperature, the drying time, and the like of the insulating material.

In order for the semiconductor chip 106 to be firmly adhered onto the island 102, it is desirable that more than half of the semiconductor chip 106 is embedded in the second insulating material 112. More desirably, the semiconductor chip 106 is subjected to die bonding such that the second insulating material 112 extends to upper ends 106s of side surfaces of the semiconductor chip 106 as shown in FIG. 1. This can increase the adhering strength of the semiconductor chip 106. Furthermore, even if the bonding wires 114a and 114b come into contact with the side surfaces of the semiconductor chip 106, an electric short-circuit between these two components can be prevented. After the die bonding of the semiconductor chip 106 and the wire bonding of the bonding wires 114a and 114b, the semiconductor chip 106 is provided with a resin seal with the molding resin 116, in order to protect the semiconductor chip 106 against external stress such as humidity, temperature, and a mechanical pressure. Various materials, including, for example, epoxy-based resins, phenolic resins, unsaturated polyester-based resins, polyurethane-based resins, silicon-based resins, and polyimide-based resins can be used as the molding resin 116. However, it is desirable that the molding resin 116 and the second insulating material 112 have substantially the same coefficient of thermal expansion. For example, in the case of using a polyimide-based resin as the second insulating material 112, it is desirable to use a polyimide-based resin as the molding resin 116 as well.

With this configuration, the semiconductor chip 106 is adhered onto the island 102 via the first insulating material 110 and the second insulating material 112, and it is therefore possible to ensure a high withstand voltage between the semiconductor chip 106 and the island 102, and firmly adhere the semiconductor chip 106 onto the island 102 with the second insulating material 112 having a high modulus of elasticity. Accordingly, it is possible to perform bonding with high positioning accuracy during wire bonding, for example.

Furthermore, with this configuration, the semiconductor chip 106 and the island 102 are insulated with two types of insulating materials. Accordingly, even if a problem arises in which the suspending leads and the inner leads are electrically short-circuited, it is possible to prevent an electrical accident between the island 102 supported by the suspending leads and the inner leads.

The first insulating material 110 also has the effect of reducing any stress resulting from the difference in coefficient of thermal expansion between the semiconductor chip 106 and the second insulating material 112, thus preventing cracking of the semiconductor chip 106.

<Second Embodiment>

Figure 2:
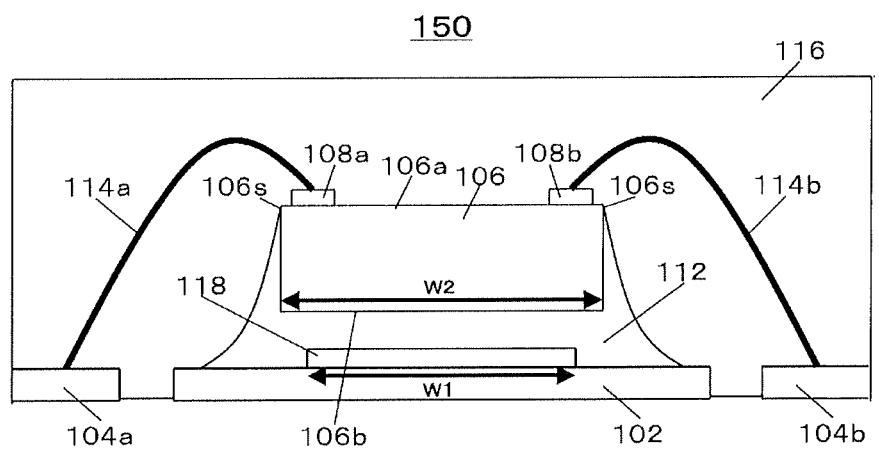
FIG. 2 is a schematic cross-sectional view showing a semiconductor device according to a second embodiment of the present invention.

FIG. 2 shows a semiconductor device according to a second embodiment of the present invention. The portions identical to those of the configuration shown in FIG. 1 are denoted by identical reference numerals, and the detailed description thereof is omitted. A semiconductor device 150 is different from its counterpart in FIG. 1 in that a first insulating material 118 is adhered onto the island 102, rather than being adhered on the semiconductor chip 106 side.

The semiconductor device 150 includes an island 102, leads 104a and 104b, a semiconductor chip 106, bonding pads 108a and 108b, a first insulating material 118, a second insulating material 112, bonding wires 114a and 114b, and a molding resin 116.

The semiconductor chip 106 is adhered onto the island 102 with the first insulating material 118 and the second insulating material 112. In the second embodiment, polyamide imide, polyimide, alumina, ceramics, or the like can be used as the first insulating material 118. The first insulating material 118 is adhered onto the island 102 as an insulating film.

The first insulating material 118 is adhered onto the island 102 as an insulating film. Accordingly, as compared to the case where a so-called insulating paste is used, it is less likely that a void is generated inside the first insulating material 118. Therefore, it is possible to increase the insulation performance of the first insulating material 118. For example, in the case of using a polyimide-based resin, it is possible to obtain a withstand voltage of about 800 V with a thickness of 20 μm. Although the thickness of the first insulating material 118 may be appropriately adjusted according to the required withstand voltage, it is desirable that the thickness of the first insulating material 118 is 5 μm or more and 50 μm or less, in order to obtain a high withstand voltage without increasing the overall size of the semiconductor device. A thickness less than 5 μm will result in a decreased withstand voltage. A thickness exceeding 50 μm will result in a reduction in adherence and an increase in generation of voids, and will also lead to an increase in inclination of the semiconductor chip 106.

The material and the shape of the second insulating material 112 in the second embodiment are the same as those in the first embodiment.

During die bonding, the second insulating material 112 is in the B stage, or in other words, in the form of a paste, and, therefore, a void may be generated thereinside. However, the insulation between the semiconductor chip 106 and the island 102 can be maintained with the first insulating material 118 adhered onto the island 102. Accordingly, a withstand voltage greater than or equal to a predetermined magnitude can be ensured between the semiconductor chip 106 and the island 102 even if a void is generated in the second insulating material 112.

In order to prevent cracking of the second insulating material 112 while ensuring high adhesion, it is desirable that the modulus of elasticity of the second insulating material 112 at room temperature is 3000 MPa or more and 10000 MPa or less. A modulus of elasticity less than 3000 MPa will result in a reduction in adhesion, whereas a modulus of elasticity exceeding 10000 MPa will result in an increase in occurrence of cracking. Further, in order to firmly adhere the semiconductor chip 106 to the island 102, it is desirable that the second insulating material 112 has a higher modulus of elasticity than that of the first insulating material 118. The second insulating material 112 is subjected to a heat curing treatment in a state in which it is in contact with the island 102, the first insulating material 118, and side surfaces and the second main surface 106b of the semiconductor chip 106. Accordingly, the semiconductor chip 106 is firmly adhered to the island 102 with the second insulating material 112. The modulus of elasticity of the second insulating material 112 can be adjusted by changing the drying temperature, drying time, and the like of the insulating material.

In order for the semiconductor chip 106 to be firmly adhered onto the island 102, it is desirable that more than half of the semiconductor chip 106 is embedded in the second insulating material 112. It is more desirable that the semiconductor chip 106 is subjected to die bonding such that the second insulating material 112 extends to upper ends 106s of side surfaces of the semiconductor chip 106, as shown in FIG. 2.

Furthermore, in order for the island 102 and the second insulating material 112 to be more firmly adhered to each other, it is more desirable to increase the adhering area between the island 102 and the second insulating material 112. The adhering area between the island 102 and the second insulating material 112 can be increased, for example, by decreasing a width W1 of the first insulating material 118 to be less than a width W2 of the semiconductor chip 106.

In order to increase the adhering area between the island 102 and the second insulating material 112, for example, the following methods are conceivable: (1) the first insulating material 118 is sized so as not to extend beyond the outer periphery of the second main surface 106b of the semiconductor chip 106; (2) the first insulating material 118 is shaped such that it does not extend beyond two opposing sides on the second main surface 106b of the semiconductor chip 106; and (3) the first insulating material 118 is shaped in a cross formed by portion intersecting at the central part of the second main surface 106b of the semiconductor chip 106 when viewed from above.

Figure 3:
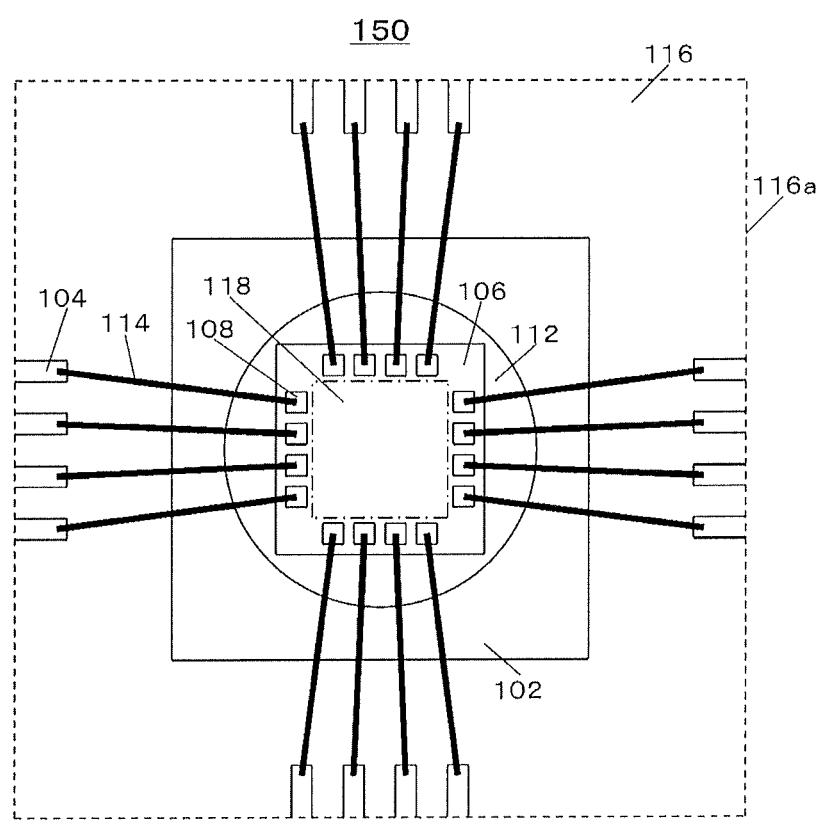
FIG. 3 is a plan view of the semiconductor device according to the second embodiment of the present invention, as viewed from the first main surface side.

FIG. 3 is a plan view of the semiconductor device 150 shown in FIG. 2. Note, however, that for the convenience of illustration the molding resin 116 is shown in perspective and the outer periphery of the molding resin 116 is indicated by a frame (dotted line) 116a.

The semiconductor device 150 includes an island 102, a plurality of leads 104, a semiconductor chip 106, a plurality of bonding pads 108, a first insulating material 118, a second insulating material 112, a plurality of bonding wires 114, and a molding resin 116. Note that the leads 104a and 104b shown in FIG. 2 are included in the plurality of leads 104, the bonding pads 108a and 108b are included in the plurality of bonding pads 108, and the bonding wires 114a and 114b are included in the plurality of bonding wires 114.

The semiconductor chip 106 is electrically connected to the leads 104 aligned in the vicinity of the outer periphery of the molding resin 116 via the bonding pads 108 aligned on the first main surface 106a and the bonding wires 114.

The first insulating material 118 is adhered onto the island 102, with its outer periphery not extending, beyond the outer periphery of the semiconductor chip 106. In order to prevent the bonding energy for wire bonding from being absorbed by the first insulating material 118, it is more desirable that the first insulating material 118 is adhered so as to avoid locations directly below the bonding pads 108. That is, when the bonding pads 108 are provided in the vicinity of the outer periphery of the first main surface 106a of the semiconductor chip 106, it is desirable that the first insulating material 118 is provided on the island 102 in a range that includes the central part of the second main surface 106b of the semiconductor chip 106 and that does not extend to a region where the bonding pads 108 are provided, as shown in FIG. 3.

With this configuration, the semiconductor chip 106 is adhered onto the island 102 via the first insulating material 118 and the second insulating material 112, and, therefore, a high withstand voltage can be ensured between the semiconductor chip 106 and the island 102. Furthermore, the semiconductor chip 106 can be firmly adhered onto the island 102 with the second insulating material 112 having a high modulus of elasticity. Accordingly, it is possible to perform high accuracy bonding during wire bonding, for example.

Figure 4:
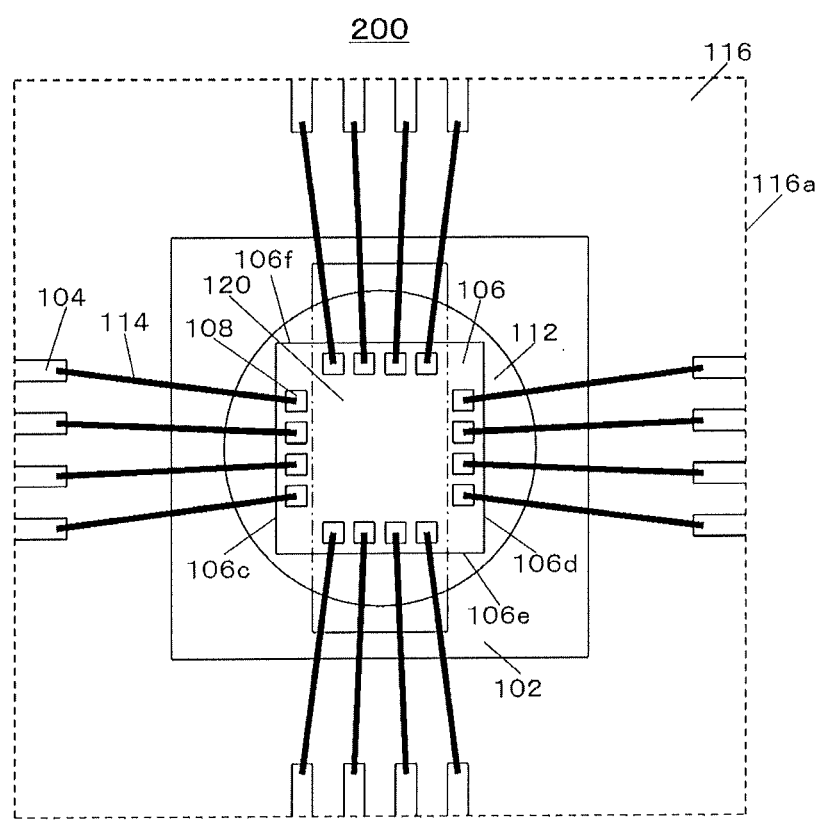
FIG. 4 is a plan view showing a first modification of the semiconductor device according to the second embodiment of the present invention.

FIG. 4 is a modification of the semiconductor device 150 shown in FIG. 3. The portions identical to those of the configuration shown in FIG. 3 are denoted by identical reference numerals, and the detailed description thereof is omitted. A semiconductor device 200 is different from its counterpart in FIG. 3 in that a first insulating material 120 is shaped such that it does not extend beyond two opposing sides 106c and 106d on the second main surface 106b of the semiconductor chip 106. That is, the first insulating material 120 is configured so as to be contained inside the area between the two sides 106c, 106d, whereas it projects from two sides 106e and 106f.

The semiconductor device 200 includes an island 102, leads 104, a semiconductor chip 106, bonding pads 108, a first insulating material 120, a second insulating material 112, bonding wires 114, and a molding resin 116.

With this configuration, in addition to achieving the effect of the semiconductor device 150 shown in FIG. 3, it is possible to prevent the semiconductor chip 106 and the island 102 from coming into contact with each other even if the semiconductor chip 106 is inclined in the direction of the longer side of the first insulating material 120, thus ensuring insulation between the semiconductor chip 106 and the island 102.

Figure 5:
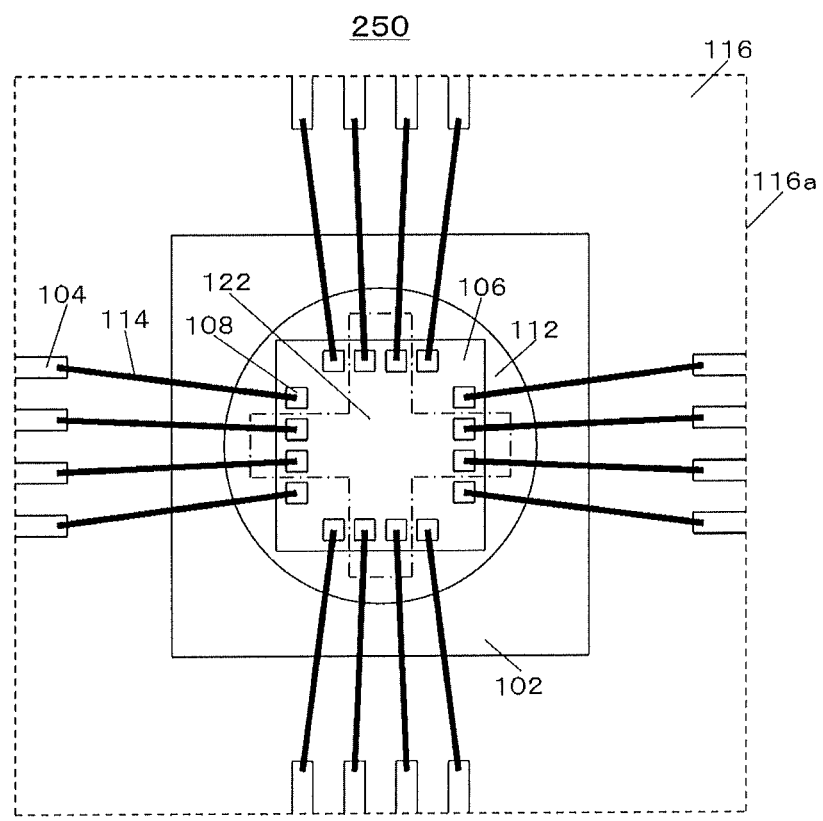
FIG. 5 is a plan view showing a second modification of the semiconductor device according to the second embodiment of the present invention.

FIG. 5 is another modification of the semiconductor device 150 shown in FIG. 3. The portions identical to those of the configuration shown in FIG. 3 are denoted by identical reference numerals, and the detailed description thereof is omitted. A semiconductor device 250 is different in configuration from its counterpart shown in FIG. 3 in that a first insulating material 122 is shaped in a cross formed by portions intersecting in an area of the island 102 that opposes the central part of the second main surface 106b of the semiconductor chip 106.

The semiconductor device 250 includes an island 102, leads 104, a semiconductor chip 106, bonding pads 108, a first insulating material 122, a second insulating material 112, bonding wires 114, and a molding resin 116.

With this configuration, as compared to the semiconductor device 150 shown in FIG. 3, it is possible to prevent the semiconductor chip 106 and the island 102 from coming into contact with each other even if the semiconductor chip 106 is inclined, thus ensuring insulation between the semiconductor chip 106 and the island 102.

Figure 6:
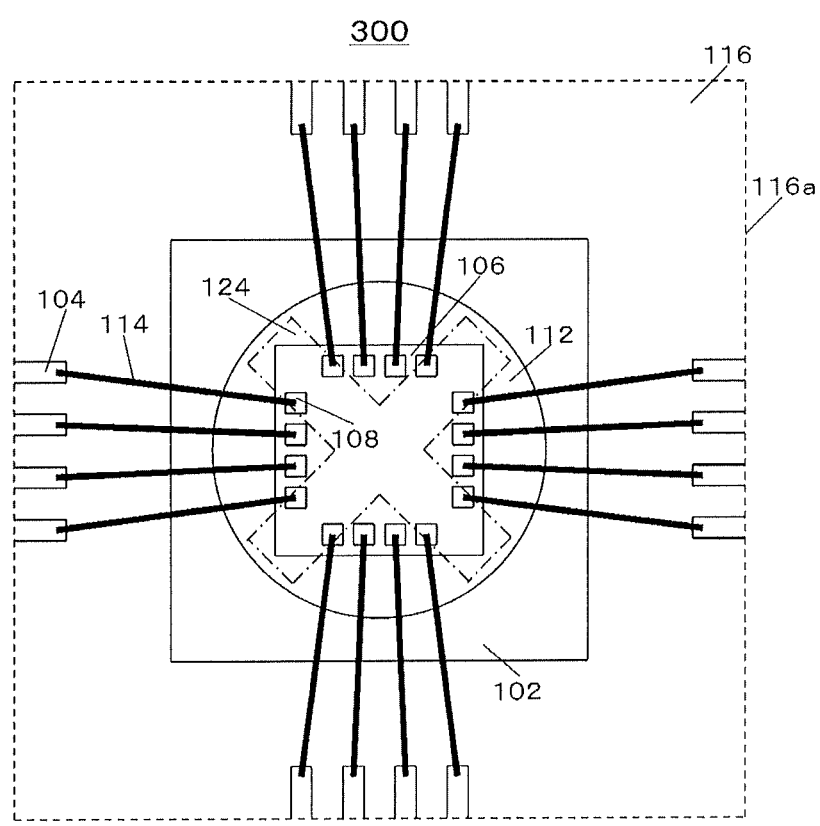
FIG. 6 is a plan view showing a third modification of the semiconductor device according to the second embodiment of the present invention.

FIG. 6 is yet another modification of the semiconductor device 150 shown in FIG. 3. The portions identical to those of the configuration shown in FIG. 3 are denoted by identical reference numerals, and the detailed description thereof is omitted. A semiconductor device 300 is different from its counterpart in FIG. 3 in that a first insulating material 124 is formed in an area on the island 102 that opposes locations in the vicinity of a diagonal line on the second main surface 106b of the semiconductor chip 106.

The semiconductor device 300 includes an island 102, leads 104, a semiconductor chip 106, bonding pads 108, a first insulating material 124, a second insulating material 112, bonding wires 114, and a molding resin 116.

With this configuration, as compared to the semiconductor device 250 shown in FIG. 5, it is also possible to prevent the semiconductor chip 106 and the island 102 from coming into contact with each other in the case of inclination of the semiconductor chip 106 in the direction of the diagonal line, which makes it possible to perform die bonding in a more stable manner.

<Third Embodiment>

Figure 7:
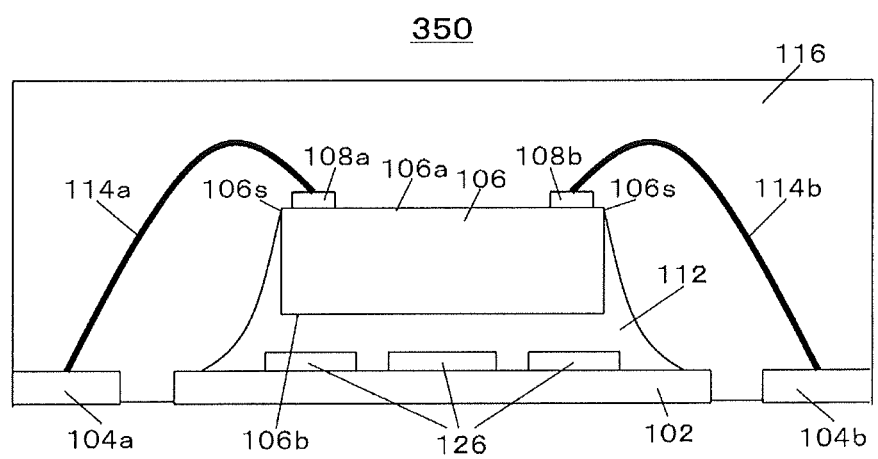
FIG. 7 is a schematic cross-sectional view showing a semiconductor device according to a third embodiment of the present invention.

FIG. 7 shows a semiconductor device according to a third embodiment of the present invention. A semiconductor device 350 is different in configuration from its counterpart shown in FIG. 2 in that a first insulating material 126 is divided into a plurality of small pieces that are disposed spaced apart on the island 102. The portions identical to those in FIG. 2 are denoted by identical reference numerals, and the detailed description thereof is omitted.

The semiconductor device 350 includes an island 102, leads 104a and 104b, a semiconductor chip 106, bonding pads 108a and 108b, a first insulating material 126, a second insulating material 112, bonding wires 114a and 114b, and a molding resin 116.

The semiconductor chip 106 is adhered onto the island 102 with the first insulating material 126 and the second insulating material 112. The materials and the manufacturing methods for the first insulating material 126 and the second insulating material 112 in the third embodiment are the same as those for the first insulating material 118 and the second insulating material 112 in the second embodiment.

Figure 8:
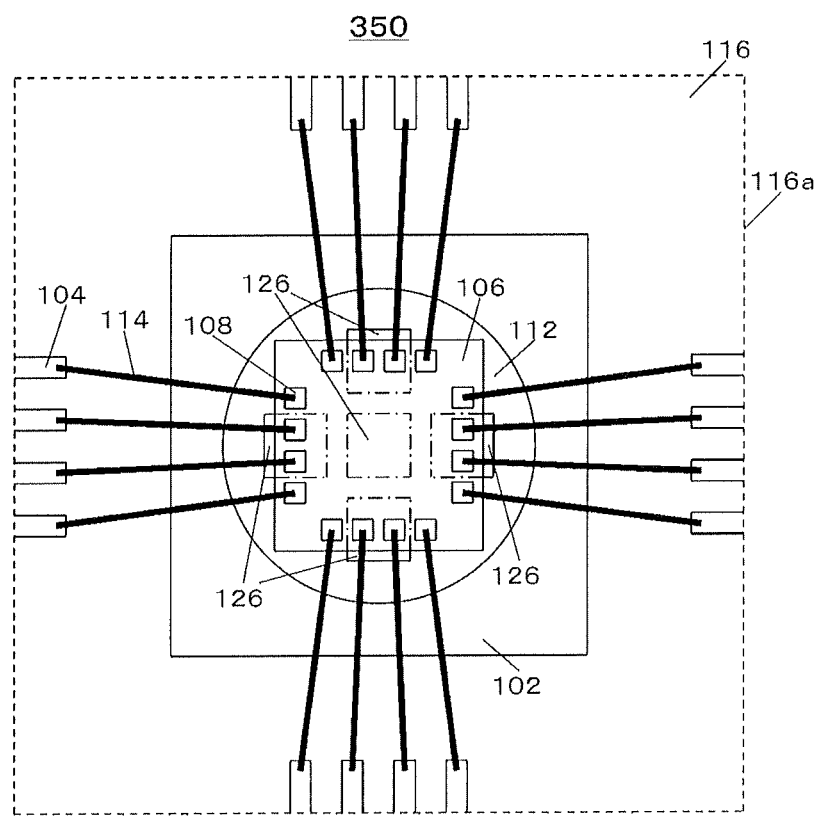
FIG. 8 is a plan view of the semiconductor device according to the third embodiment of the present invention, as viewed from the first main surface side.

FIG. 8 is a plan view of the semiconductor device 350 shown in FIG. 7. The portions identical to those of the configuration shown in FIG. 7 are denoted by identical reference numerals, and the detailed description thereof is omitted. Note, however, that for the convenience of description the molding resin 116 is shown in perspective and the outer periphery of the molding resin 116 is indicated by a frame (dotted line) 116a.

The semiconductor device 350 includes an island 102, a plurality of leads 104, a semiconductor chip 106, a plurality of bonding pads 108, a first insulating material 126, a second insulating material 112, a plurality of bonding wires 114, and a molding resin 116. Note that the leads 104a and 104b shown in FIG. 7 are included in the plurality of leads 104, the bonding pads 108a and 108b are included in the plurality of bonding pads 108, and the bonding wires 114a and 114b are included in the plurality of bonding wires 114.

The semiconductor chip 106 is electrically connected to the leads 104 aligned in the vicinity of the outer periphery of the molding resin 116 via the bonding pads 108 aligned on the first main surface 106a and the bonding wires 114.

With this configuration, in addition to achieving the effect of the semiconductor device 150 shown in FIGS. 2 and 3, it is possible to prevent the semiconductor chip 106 and the island 102 from coming into contact with each other even if the semiconductor chip 106 is inclined, thus ensuring insulation between the semiconductor chip 106 and the island 102. Furthermore, it is possible to increase the adhering area between the second insulating material 112 and the island 102, as compared to FIG. 3. This allows the semiconductor chip 106 to be firmly adhered onto the island 102, thus enabling more accurate wire bonding. Additionally, since the first insulating material 126 is divided into a plurality of small pieces, a plurality of gap portions are formed. Accordingly, even if any voids are generated in the second insulating material 112, such voids can be confined in the gap portions.

Figure 9:
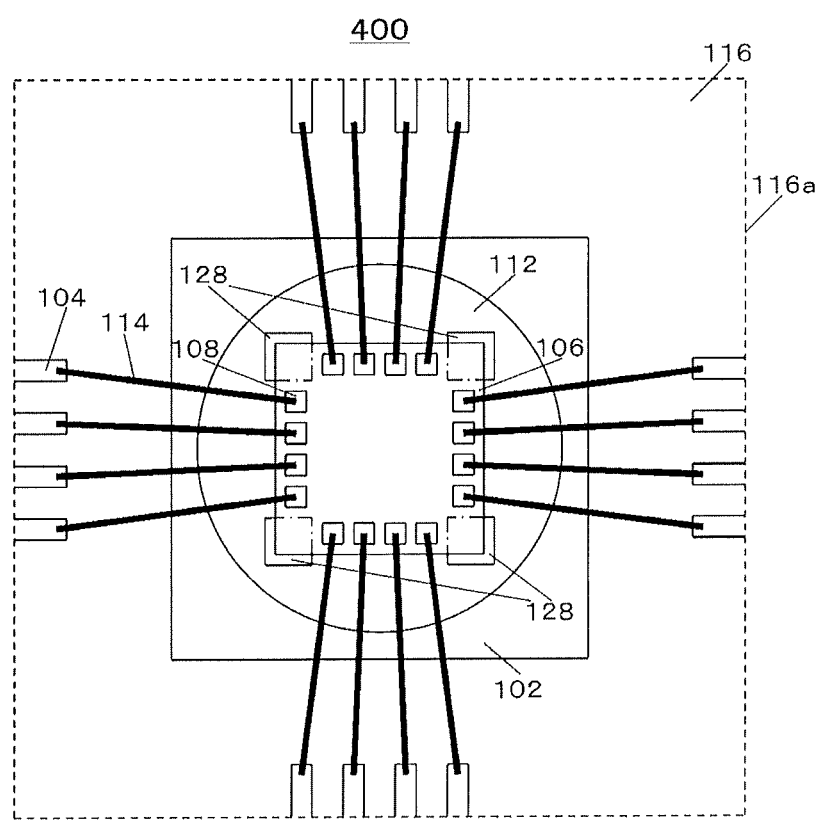
FIG. 9 is a plan view showing a modification of the semiconductor device according to the third embodiment of the present invention.

FIG. 9 is another modification of the semiconductor device 350 shown in FIG. 8. The portions identical to those of the configuration shown in FIG. 8 are denoted by identical reference numerals, and the detailed description thereof is omitted. A semiconductor device 400 is different in configuration from its counterpart shown in FIG. 8 in that a first insulating material 128 is formed in areas on the island 102 that oppose locations in the vicinity of vertices of the second main surface 106b of the semiconductor chip 106. "Locations in the vicinity of vertices" refer to a range of locations that includes vertices and the distance from the vertices to which does not exceed the length of one fourth of a side of the second main surface 106b.

The semiconductor device 400 includes an island 102, leads 104, a semiconductor chip 106, bonding pads 108, a first insulating material 128, a second insulating material 112, bonding wires 114, and a molding resin 116.

With this configuration as well, it is possible to achieve the effect of the semiconductor device 350 shown in FIG. 8. Furthermore, since the first insulating material 128 is adhered onto the island 102 in locations opposing the outer periphery of the second main surface 106b of the semiconductor chip 106, it is possible to prevent the semiconductor chip 106 and the island 102 from coming into contact with each other when the semiconductor chip 106 is inclined. Accordingly, it is possible to appropriately ensure insulation between the semiconductor chip 106 and the island 102 even when the semiconductor chip 106 is inclined during die bonding.

As the third embodiment, a description has been given of a semiconductor device in which a plurality of divided pieces of the first insulating material are adhered onto the island 102 in order to increase the adhering area between the second insulating material 112 and the island 102. The first insulating material may not necessarily be divided into a plurality of small pieces, and the adhering area between the second insulating material 112 and the island 102 can also be increased, for example, by providing a first insulating material 130 with an aperture 132 extending to the island 102 as shown in FIGS. 10 and 11.

Figure 10:
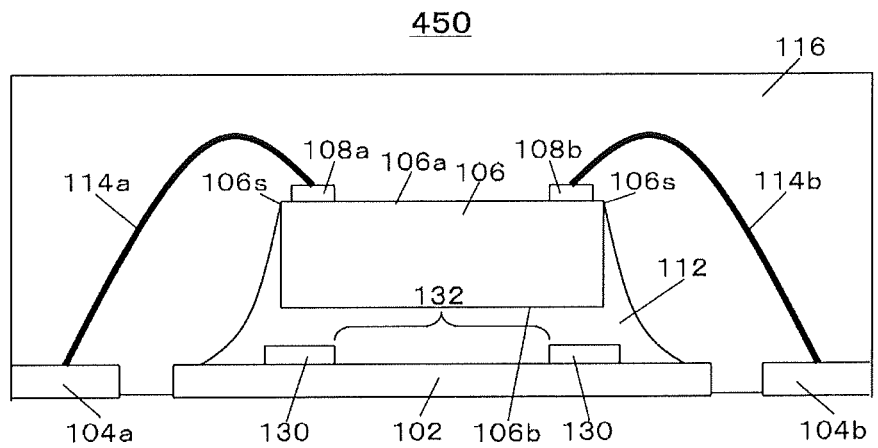
FIG. 10 shows another modification of the semiconductor device according to the third embodiment of the present invention.

FIG. 10 shows another modification of the semiconductor device 350 shown in FIG. 7. The portions identical to those of the configuration shown in FIG. 7 are denoted by identical reference numerals, and the detailed description thereof is omitted. A semiconductor device 450 is different in configuration from its counterpart shown in FIG. 7 in that a first insulating material 130 is provided with an aperture 132 extending to the island 102, instead of dividing the first insulating material 130 into a plurality of small pieces. In the case of providing the first insulating material 130 with the aperture 132 as well, it is possible to achieve the same effect as that achieved in the case of dividing it into a plurality of small pieces.

The semiconductor device 450 includes an island 102, leads 104a and 104b, a semiconductor chip 106, bonding pads 108a and 108b, a first insulating material 130, an aperture 132 provided in the first insulating material 130, a second insulating material 112, bonding wires 114a and 114b, and a molding resin 116.

Figure 11:
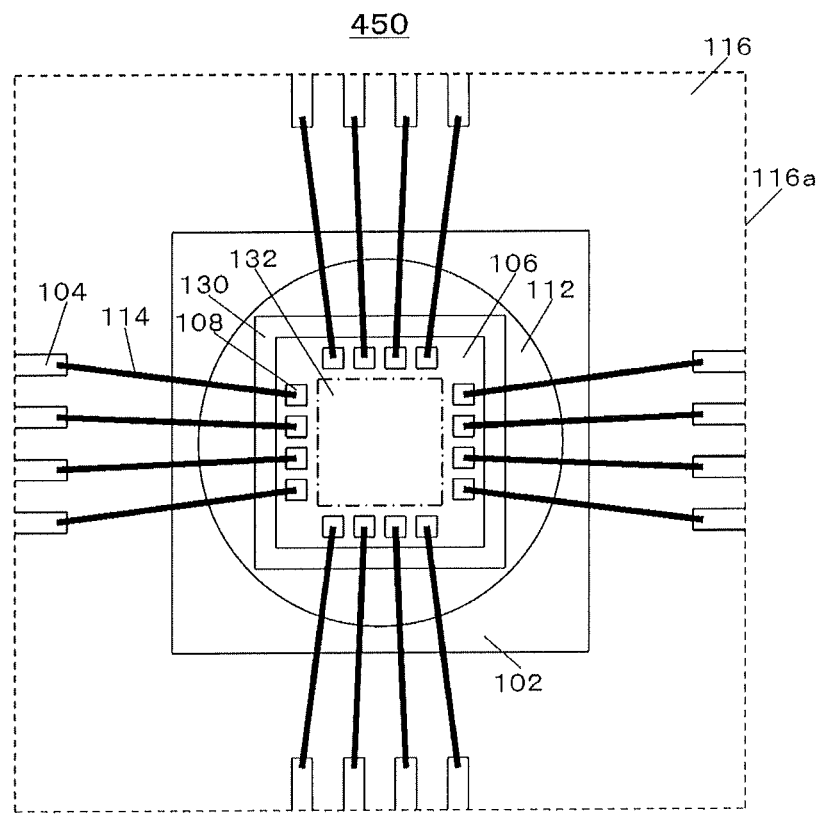
FIG. 11 is a plan view of the semiconductor device shown in FIG. 10, as viewed from the first main surface side.

FIG. 11 is a plan view of the semiconductor device 450 shown in FIG. 10. The portions identical to those of the configuration shown in FIG. 10 are denoted by identical reference numerals, and the detailed description thereof is omitted. Note, however, that for the convenience of illustration the molding resin 116 is shown in perspective and the outer periphery of the molding resin 116 is indicated by a frame (dotted line) 116a.

The semiconductor device 450 includes an island 102, a plurality of leads 104, a semiconductor chip 106, a plurality of bonding pads 108, a first insulating material 130, an aperture 132, a second insulating material 112, a plurality of bonding wires 114, and a molding resin 116. Note that the leads 104a and 104b shown in FIG. 10 are included in the plurality of leads 104.

With this configuration, the second insulating material 112 is adhered to the island 102 through the aperture 132 provided in the first insulating material 130. Accordingly, the adhering area between the second insulating material 112 and the island 102 is increased. Therefore, the semiconductor chip 106 is firmly adhered onto the island 102, thus enabling more accurate wire bonding. Alternatively, a plurality of apertures 132 may be provided in the semiconductor device 450 shown in FIG. 11.

<Fourth Embodiment>

Figure 12:
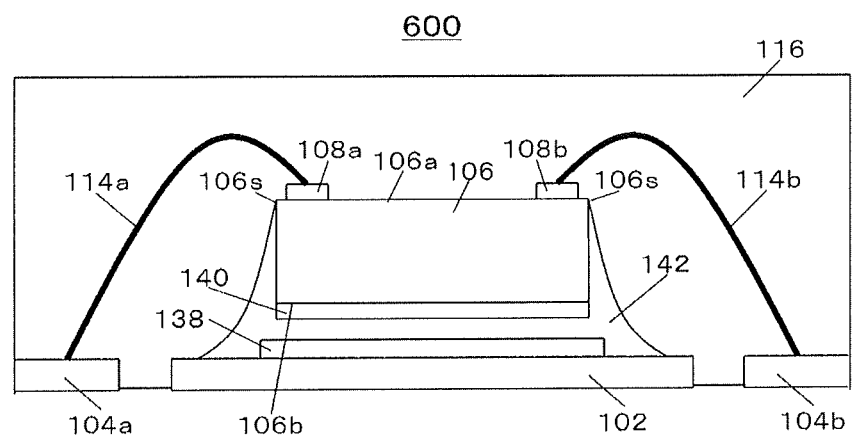
FIG. 12 is a schematic cross-sectional view showing a semiconductor device according to a fourth embodiment of the present invention.

FIG. 12 shows a semiconductor device according to a fourth embodiment of the present invention. In a semiconductor device 600, a first insulating material 138 is adhered onto an island 102. Also, a third insulating material 140 is adhered to a second main surface 106b of a semiconductor chip 106. Furthermore, the semiconductor chip 106 and the island 102 adhered to each other with a second insulating material 142. In these respects, the semiconductor device 600 is different in configuration from its counterpart shown in FIG. 1. The portions identical to those in FIG. 1 are denoted by identical reference numerals, and the detailed description thereof is omitted.

The semiconductor device 600 includes an island 102, leads 104a and 104b, a semiconductor chip 106, bonding pads 108a and 108b, a first insulating material 138, a second insulating material 142, a third insulating material 140, bonding wires 114a and 114b, and a molding resin 116.

The semiconductor chip 106 is adhered onto the island 102 with the first insulating material 138, the second insulating material 142, and the third insulating material 140. In the fourth embodiment, the materials and the properties of the first insulating material 138 and the second insulating material 142 are the same as those of the first insulating material 118 and the second insulating material 112 in the second embodiment shown in FIG. 2.

The material and the properties of the third insulating material 140 are the same as those of the first insulating material 110 in the first embodiment shown in FIG. 1.

With this configuration, the semiconductor chip 106 is adhered onto the island 102 via the first insulating' material 138, the second insulating material 142, and the third insulating material 140, and it is therefore possible to provide insulation between the semiconductor chip 106 and the island 102 with a higher withstand voltage, in addition to achieving the effect of the semiconductor device 100 shown in FIG. 1.

<Fifth Embodiment>

Figure 13:
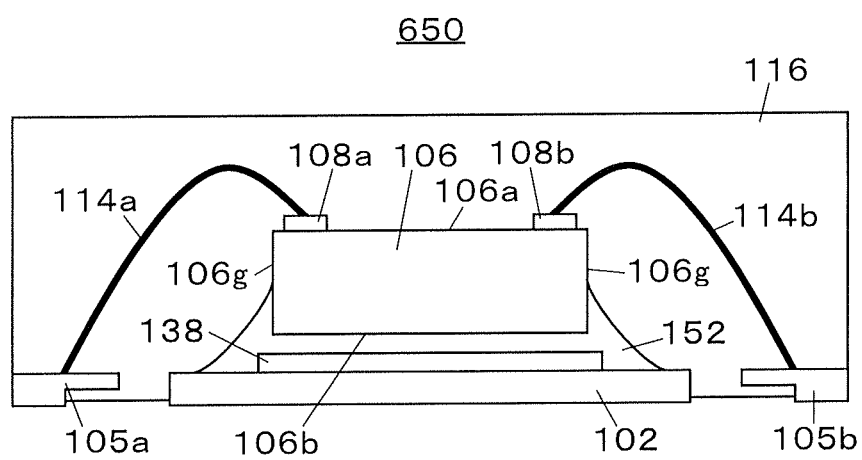
FIG. 13 is a schematic cross-sectional view showing a semiconductor device according to a fifth embodiment of the present invention.
Figure 14:
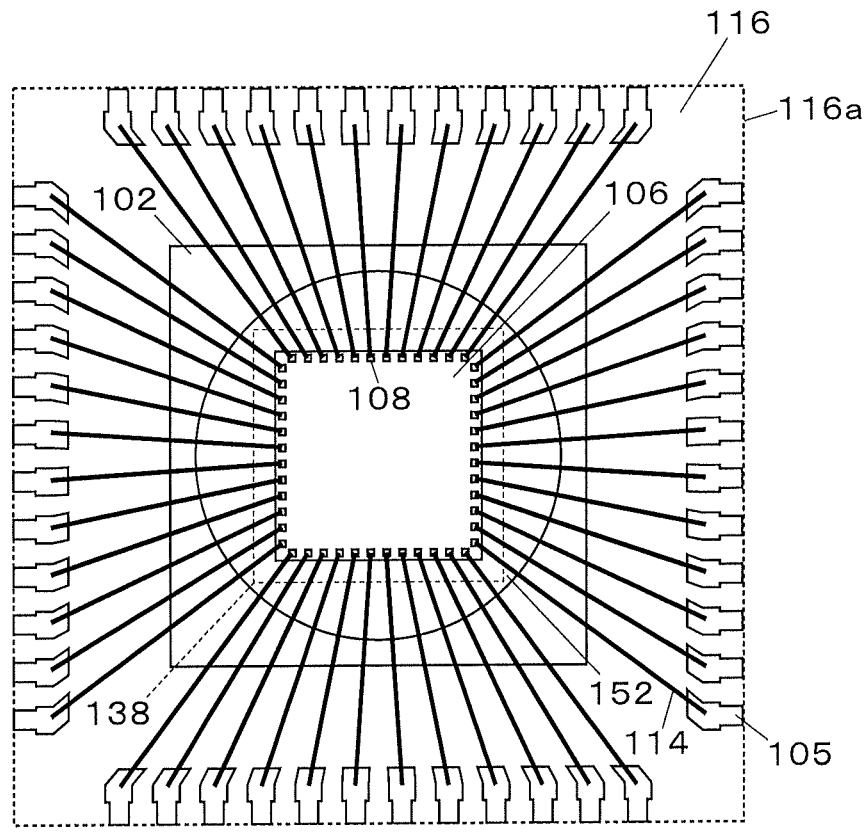
FIG. 14 is a plan view of the semiconductor device shown in FIG. 13, as viewed from the first main surface side.

FIGS. 13 and 14 show a semiconductor device according to a fifth embodiment of the present invention. A semiconductor device 650 is different in configuration from its counterpart shown in FIG. 12 in that the third insulating material 140 is not provided and in the configurations of a second insulating material 152 and leads 105. The portions identical to those in FIG. 12 are denoted by identical reference numerals, and the detailed description thereof is omitted.

The semiconductor device 650 includes an island 102, a plurality of leads 105, a semiconductor chip 106, a plurality of bonding pads 108, a first insulating material 138, a second insulating material 152, a plurality of bonding wires 114, and a molding resin 116. Note that the leads 105a and 105b shown in FIG. 13 are included in the plurality of leads 105, the bonding pads 108a and 108b are included in the plurality of bonding pads 108, and the bonding wires 114a and 114b are included in the plurality of bonding wires 114.

The first insulating material 138 has lager dimensions in plan view than those of the semiconductor chip 106. As clearly shown in FIG. 14, the four sides of the first insulating material 138 are disposed outwardly beyond all the four sides of the semiconductor chip 106. The second insulating material 152 is made of the same material as that of the second insulating material 142 shown in FIG. 12. In this embodiment, the second insulating material 152 covers about half of side surfaces 106g of the semiconductor chip 106.

Figure 15:
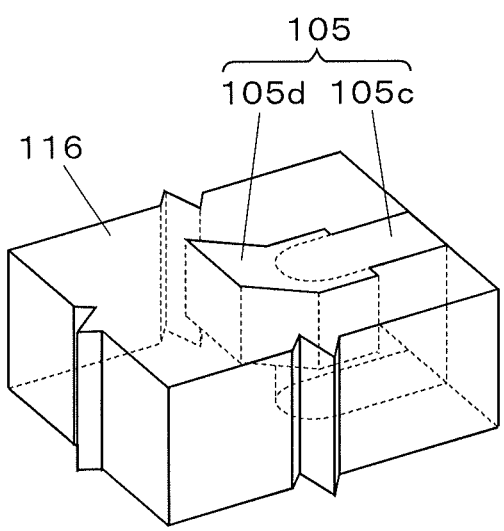
FIG. 15 is an enlarged perspective view showing a principal part of a lead of the semiconductor device shown in FIG. 13.

As shown in FIG. 14, the semiconductor device 650 has significantly larger numbers of the plurality of bonding pads 108 and the plurality of leads 105 as compared to the configurations shown in FIGS. 3 to 6, 8, 9, and 11. The plurality of leads 105 are disposed along the four sides of the molding resin 116, proximally to both ends of each side. FIG. 15 shows a lead 105 in enlargement. As can be understood from the drawing, the lead 105 includes a semi-elliptical portion 105c and an oblique portion 105d. The semi-elliptical portion 105c extends through the molding resin 116, starting from the position at which a bonding wire 114 is bonded and down to the lower surface of the molding resin 116 from. The oblique portion 105d extends in a direction parallel, in plan view, to the bonding wire 114 that is to be bonded. The oblique portion 105d is formed in about half of the region extending to the lower surface of the molding resin 116 from the position at which the bonding wire 114 is to be bonded. Accordingly, when the semiconductor device 650 is observed from the lower side, only the semi-elliptical portion 105c of the lead 105 is visible, and the oblique portion 105d is hidden.

With this configuration, even if the semiconductor chip 106 is inclined, one of the four sides of the semiconductor chip 106 is supported by the first insulating material 138. Accordingly, it is possible to prevent the semiconductor chip 106 from unduly coming into contact with the island 102 in a suitable manner.

Since the lead 105 includes the oblique portion 105d, the bonding wire 114, which assumes an attitude of inclination to the four sides of the semiconductor chip 106 and the molding resin 116, can be appropriately bonded. Furthermore, a bonding wire 114 that is bonded to a particular lead 105 can be prevented from coming into contact with the lead 105 located adjacent to that particular lead 105. The inclination of the bonding wire 114 tends to increase with increasing numbers of the plurality of bonding pads 108 and the plurality of leads 105. Therefore, the configuration of the semiconductor device 650 is effective when the numbers of the plurality of bonding pads 108 and the plurality of leads 105 are relatively large.

A more specific configuration of the semiconductor chip 106 that can be used for the semiconductor device 650 will be described below with reference to FIGS. 16 to 19. Note that the semiconductor chip 106 used for the semiconductor devices 100, 150, 200, 250, 300, 350, 400, 450, and 600 may have the configuration described hereinafter.

Figure 16:
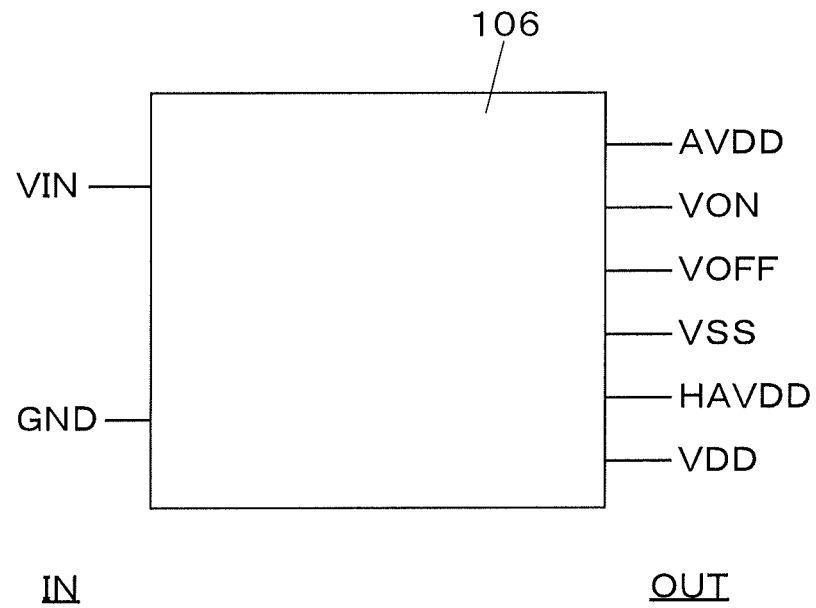
FIG. 16 is a schematic configuration diagram showing a semiconductor chip used for a semiconductor device of the present invention.

The plurality of bonding pads 108 included in the semiconductor chip 106 function as a plurality of terminals shown in FIG. 16. Specifically, terminals VIN and GND are provided on the input side, and terminals AVDD, VON, VOFF, VSS, HAVDD, and VDD are provided on the output side. For example, as the conditions for the input side, the potential of the terminal GND is set to 0 V and the potential of the terminal VIN is set to 12 V. The terminals on the output side are designed such that their potentials have a predetermined magnitude with respect to the potential of the terminal GND. In particular, the potential of the terminal VOFF is −10 V, and the potential of the terminal VSS is −7.5 V. As an example, the terminal AVDD is at 15 V, the terminal VON is at 28 V, the terminal HAVDD is at 7.5 V, and the terminal VDD is at 3.3 V. In this way, the semiconductor chip 106 realizes, with a so-called one-chip, the function of generating the potentials of the terminals on the output side such that they are negative voltages with respect to the potential of the terminal GND serving as a reference potential. The semiconductor device 650 can also be used as a system power supply that controls a power supply required for a liquid display panel. This power supply has a plurality of positive voltages and a plurality of negative voltages. Note that positive voltages can be generated, for example, by a system such as a charge pump system, or a regulator system (e.g., a switching regulator or a series regulator).

Figure 17:
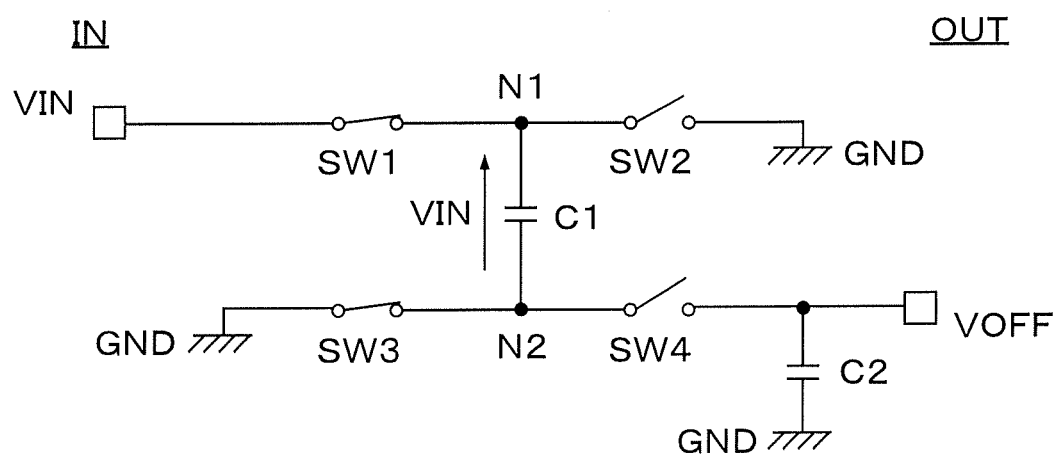
FIG. 17 is a schematic circuit diagram for illustrating the function of the semiconductor chip shown in FIG. 16.
Figure 18:
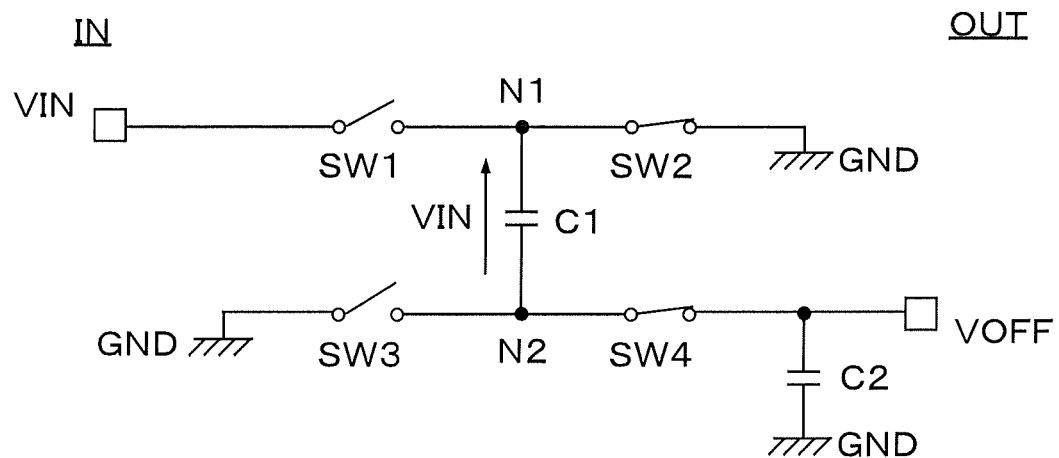
FIG. 18 is a schematic circuit diagram for illustrating the function of the semiconductor chip shown in FIG. 16.

The procedure for setting the potential of the terminal VOFF to a negative voltage in the semiconductor chip 106 will be described with reference to FIGS. 17 and 18. First, as shown in FIG. 17, capacitors C1 and C2, and switches SW1, SW2, SW3, and SW4 are disposed between the terminal VIN on the input side and the terminal VOFF on the output side, and contacts N1 and N2 are provided across the capacitor C1. In the state shown in this drawing, the switches SW1 and SW3 are closed, whereas the switches SW2 and SW4 are open. In this state, the potential of the contact N1 is higher than the potential of the contact N2 by an amount corresponding to the potential of the terminal VIN. That is, the potential difference between the terminal GND and the terminal VIN is applied to the capacitor C1. Consequently, the capacitor C1 is charged by the potential difference between the terminal GND and the terminal VIN. Next, as shown in FIG. 18, the switches SW1 and SW3 are opened, and the switches SW2 and SW4 are closed. Then, the potential of the contact N1 is set to 0 V, which is the same as that of the terminal GND. Since the voltage applied to the capacitor C1 is maintained as is, the potential of the contact N2 is a voltage lower than the potential of the terminal GND by an amount corresponding to the potential of the terminal VIN. Accordingly, the potential of the terminal VOFF is set to a negative potential having the same absolute value as that of the terminal VIN, with respect to the potential of the terminal GND.

Figure 19:
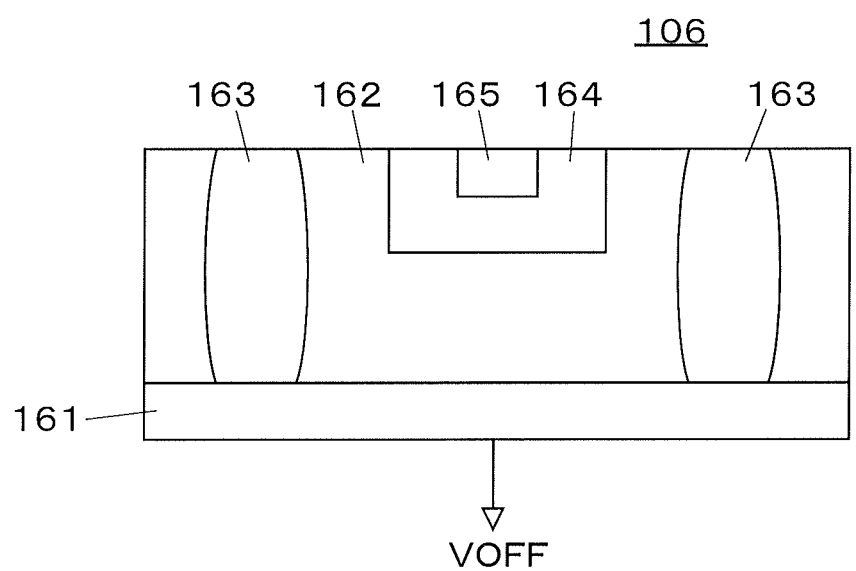
FIG. 19 is a schematic cross-sectional view for illustrating the internal structure of the semiconductor chip shown in FIG. 16.

When a circuit that generates the voltage of a terminal on the output side so as to be a negative voltage with respect to the potential of the terminal GND, the potential of the terminal on the output side that is set to a negative voltage needs to be used as reference potential inside the semiconductor chip 106 as shown in FIG. 19. As schematically shown in FIG. 19, an n-type region 162 is formed on a p-type substrate 161 inside the semiconductor chip 106. In FIG. 19, a PNP transistor structure included in the semiconductor chip 106 is shown as an example. Two p-type regions 163 are formed so as to sandwich the n-type region 162. A p-type region 164 is formed on the opposite side from the p-type substrate 161 across the n-type region 162. An n-type region 165 is formed so as to be surrounded by the p-type region 164. The terminal connected to the n-type region 162 functions as a so-called collector, the terminal connected to the p-type region 164 functions as a so-called base, and the terminal connected to the n-type region 165 functions as a so-called emitter. In this PNP transistor structure, a p-n junction created between the p-type semiconductor and the n-type semiconductor can be formed everywhere, and such p-n junction may constituted a parasitic device. Unless the potential of the terminal VOFF connected to p-type substrate 161 is set to the lowest potential, the above-described parasitic device will be operated unduly. To prevent such operation of the parasitic device, it is desirable to provide insulation between the semiconductor chip 106 and the island 102 in a reliable manner. In this respect, the semiconductor device 650 that can enhance the performance of insulation between the semiconductor chip 106 and the island 102 is preferable.

Figure 20:
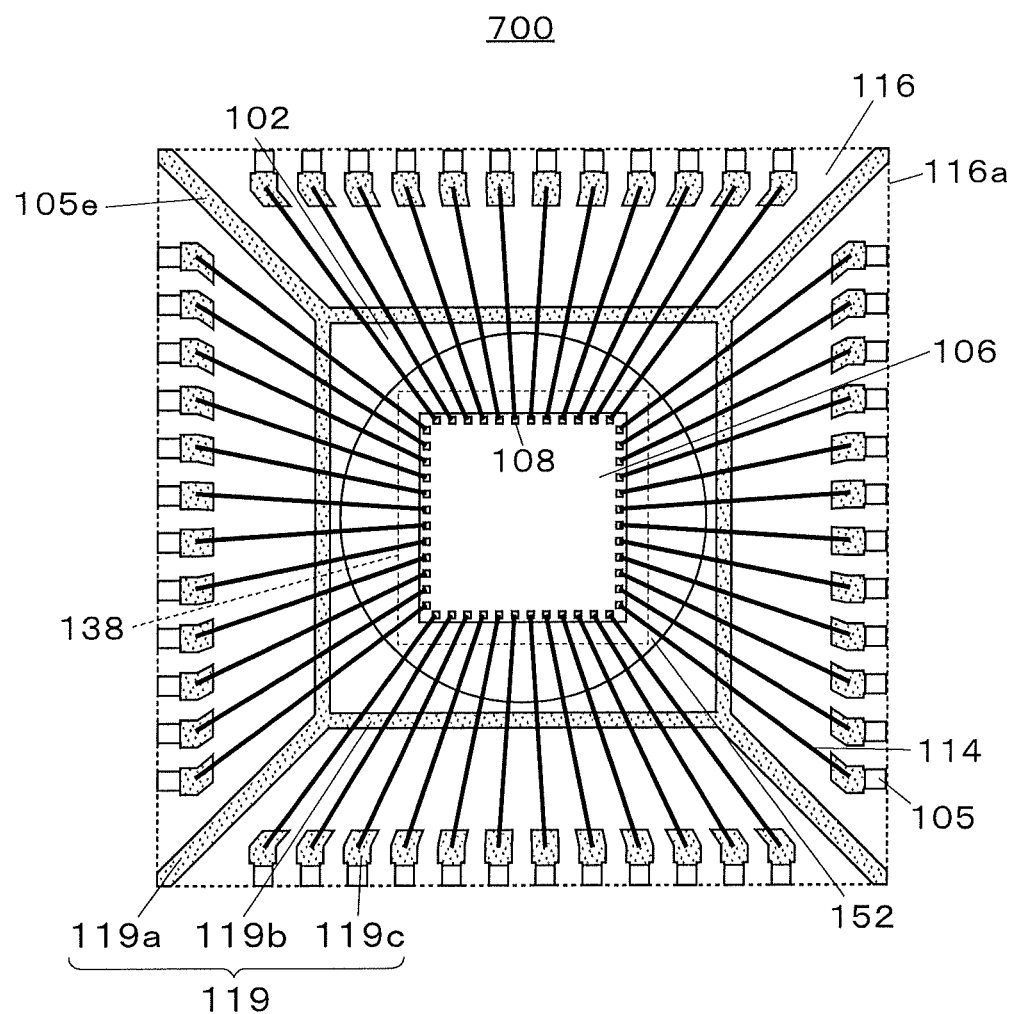
FIG. 20 is a plan view showing a modification of the semiconductor device according to the fifth embodiment of the present invention.

FIG. 20 shows a modification of the semiconductor device 650 shown in FIGS. 13 to 15. The portions identical to those of the configuration shown in FIGS. 13 to 15 are denoted by identical reference numerals, and the detailed description thereof is omitted.

A semiconductor device 700 according to this modification includes four suspending leads 105e and a plated layer 119. The four suspending leads 105e are coupled to the four corners of an island 102, and extend toward the four corners of a molding resin 116.

The plated layer 119 is made of, for example, Ag, and includes four suspending lead portions 119a, an outer edge portion 119b, and a plurality of lead portions 119c. The suspending lead portions 119a are formed at the suspending leads 105e, and cover the suspending leads 105e over the entire length. The outer edge portion 119b is formed in a region of an island 102 that includes a region in contact with a second insulating material 152. The outer edge portion 119b is in contact with the outer edge of the island 102, and the outer edge portion 119b of this modification is in contact with the entire perimeter of the outer edge of the island 102. Consequently, the outer edge portion 119b is shaped in a rectangular frame. The lead portions 119c are formed at their respective leads 105. Each lead portion 119c is formed in the oblique portion 105d and a portion of the semi-elliptical portion 105c shown FIG. 15 located toward the oblique portion 105d. The bonding wires 114 are connected to the leads 105 via the lead portions 119c.

According to this modification, a relatively clear contrast is created by the portion where the island 102 is exposed and the plated layer 119. This provides an advantage in that the positions and the shapes of the island 102 and the plurality of leads 105 can be easily recognized in an image recognition process for forming the mount of the semiconductor chip 106 or the bonding wires 114 during manufacture of the semiconductor device 700. Particularly, forming the plated layer 119 with Ag can be expected to achieve the effect of increasing the contrast relative to the island 102 and the plurality of leads 105 that are made of Cu—Fe—P, which is a Cu-based material, a Fe 58%-Ni 42% alloy, which is a Fe-based material, and the like.

Figure 21:
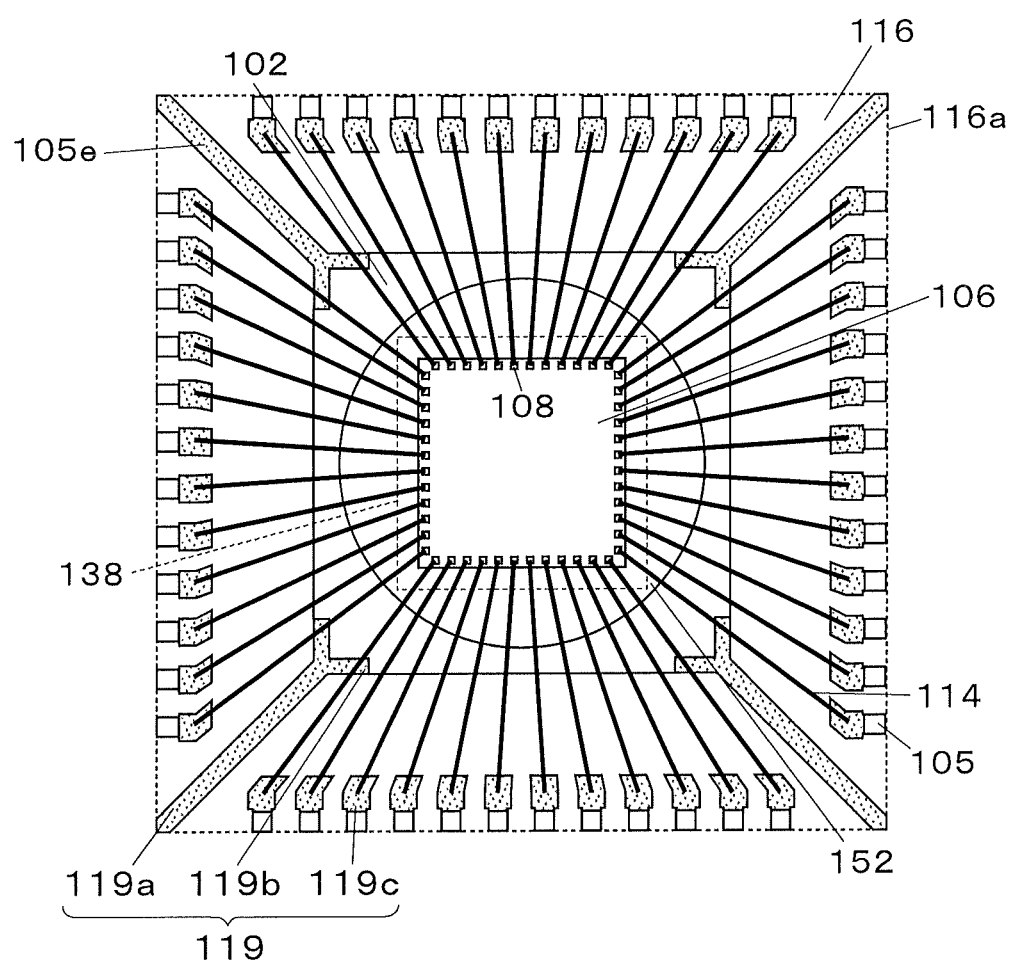
FIG. 21 is a plan view showing a modification of the semiconductor device according to the fifth embodiment of the present invention.

FIG. 21 is another modification of the semiconductor device 650 shown in FIGS. 13 to 15. The portions identical to those of the configuration shown in FIGS. 13 to 15 and 20 are denoted by identical reference numerals, and the detailed description thereof is omitted.

A semiconductor device 750 according to this modification is different from the above-described semiconductor device 700 with respect to the configuration of the outer edge portion 119b of the plated layer 119. In this modification, the outer edge portion 119b is constituted by four elements formed at the four corners of the island 102. The outer edge portion 119b with this configuration can be described as having areas that are spaced apart between the corners of the island 102.

With this modification as well, a relatively clear contrast is created by the portion where the island 102 is exposed and the plated layer 119. This provides an advantage in that the positions and the shapes of the island 102 and the plurality of leads 105 can be easily recognized in an image recognition process for forming the mount of the semiconductor chip 106 or the bonding wires 114 during manufacture of the semiconductor device 750.

Figure 22:
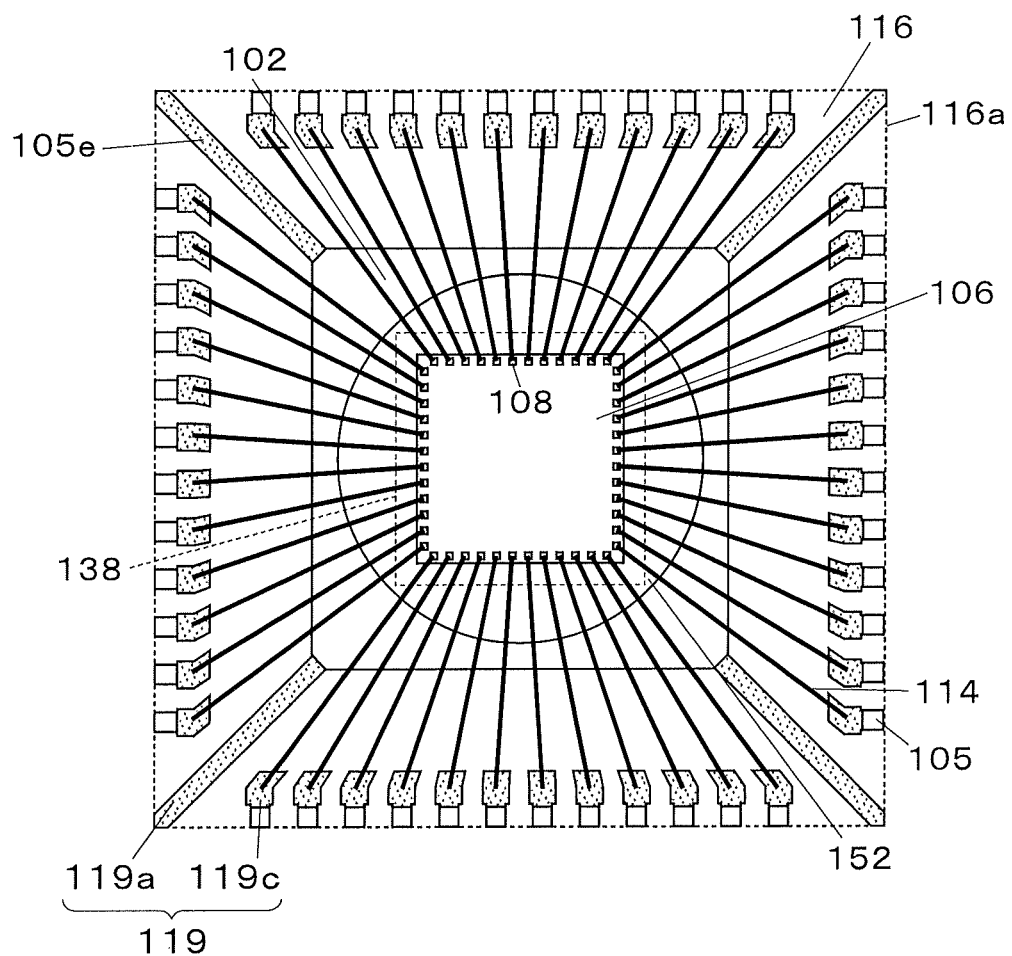
FIG. 22 is a plan view showing a modification of the semiconductor device according to the fifth embodiment of the present invention.
Figure 23:
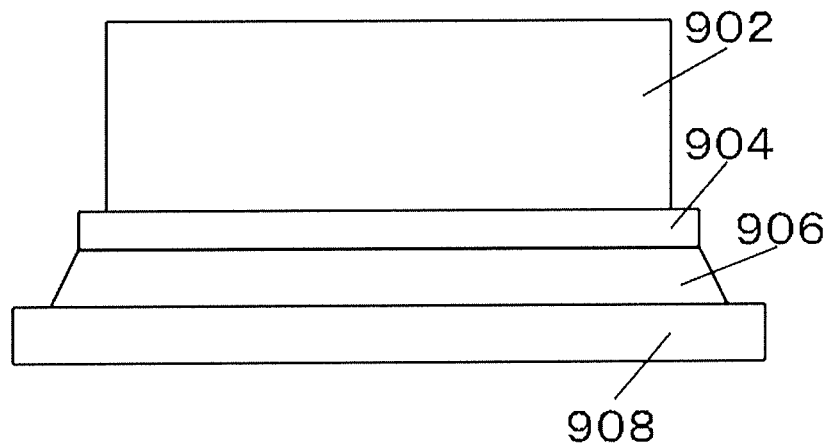
FIG. 23 shows a conventional semiconductor device.

FIG. 22 shows another modification of the semiconductor device 650 shown in FIGS. 13 to 15. The portions identical to those of the configuration shown in FIGS. 13 to 15 and 20 are denoted by identical reference numerals, and the detailed description thereof is omitted.

In a semiconductor device 800 according to this modification, a plated layer 119 is consisting only of four suspending lead portions 119a and a plurality of lead portion 119c. With this modification as well, a relatively clear contrast is created by the portion where the island 102 is exposed and the plated layer 119. This provides an advantage in that the positions and the shapes of the island 102 and the plurality of leads 105 can be easily recognized in an image recognition process for forming the mounting of the semiconductor chip 106 or the bonding wires 114 during manufacture of the semiconductor device 800.

In the semiconductor devices described herein, it is possible to adopt a configuration in which the first insulating material and the second insulating material may be a mixture of two or more materials. Mixing two or more materials allows the modulus of elasticity and the volume resistivity to be flexibly adjusted.

Industrial Applicability

As described above, according to a semiconductor device and a method for manufacturing the same according to the present invention, a semiconductor chip is adhered onto an island with a first insulating material and a second insulating material, and, therefore, the first insulating material and the second insulating material together provide a high withstand voltage between the semiconductor chip and the island, and the semiconductor chip is firmly adhered onto the island with the second insulating material having a higher modulus of elasticity than that of the first insulating material. Accordingly, it is possible to reduce product failures during wire bonding, for example. Furthermore, since the semiconductor chip and the island are insulated with a high withstand voltage, it is possible to prevent minute leakage current to an external substrate in QFN packages and the like, in which the island is exposed to the outside, and thereby to achieve high industrial applicability.

The invention claimed is:

1. A semiconductor device comprising:
   a supporting member;
   a first insulating layer on the supporting member;
   a second insulating layer on the first insulating layer; and
   a semiconductor chip mounted on the supporting member with the first and second insulating layers interposed between the semiconductor chip and the supporting member,
   the semiconductor chip comprising a first main surface, a second main surface opposite to the first main surface, and side surfaces connected to both the first main surface and the second main surface, the first main surface being provided with a bonding pad, the second main surface facing the supporting member with the first insulating layer and the second insulating layer interposed therebetween; and
   the second insulating layer being in contact with the second main surface, the side surfaces, and the first insulating layer.

2. The semiconductor device according to claim 1, wherein the first insulating layer is disposed outwardly beyond all outer sides of the second main surface.

3. The semiconductor device according to claim 1, wherein the first insulating layer is covered with the second insulating layer.

4. The semiconductor device according to claim 1, wherein the second insulating layer comprises an insulating paste.

5. The semiconductor device according to claim 1, wherein the second insulating layer has a modulus of elasticity not smaller than 3000 MPa and not greater than 10000 MPa.

6. The semiconductor device according to claim 1, wherein the first insulating layer has a modulus of elasticity not smaller than 1000 MPa and not greater than 5000 MPa.

7. The semiconductor device according to claim 1, further comprising a third insulating layer that covers a part of the supporting member, the semiconductor chip, the first insulating layer and the second insulating layer, wherein the supporting member includes a lower surface exposed to an outside of the third insulating layer.

8. The semiconductor device according to claim 1, wherein the supporting member is supported by a suspending lead.

9. The semiconductor device according to claim 1, further comprising a third insulating layer attached to the second main surface.

10. The semiconductor device according to claim 1, wherein the first insulating layer has a volume resistivity not smaller than 1000 GΩ·cm.

11. The semiconductor device according to claim 1, wherein the first insulating layer is fixed to the supporting member so as not to be disposed outwardly beyond outer sides of the second main surface.

12. The semiconductor device according to claim 1, wherein the second main surface is quadrilateral, and
   the first insulating layer is attached to the supporting member so as not to be disposed outwardly beyond two opposite sides of the second main surface.

13. The semiconductor device according to claim 1, wherein the first insulating layer is formed into a cross intersecting at a portion on the supporting member facing a center of the second main surface, the first insulating layer being fixed to the supporting member.

14. The semiconductor device according to claim 1, wherein the first insulating layer comprises a plurality of pieces separate from each other and disposed in a region of the supporting member facing the second main surface.

15. The semiconductor device according to claim 1, wherein the first insulating layer is formed with a though-hole extending to the supporting member.

16. The semiconductor device according to claim 1, wherein the first insulating layer covers the second main surface, and
   the second insulating layer is held in contact with and fixed to: the side surfaces; the first insulating layer; and the supporting member.

17. The semiconductor device according to claim 16, wherein the first insulating layer is covered with the second insulating layer.

18. The semiconductor device according to claim 16, wherein the second insulating layer has a modulus of elasticity not smaller than 3000 MPa and not greater than 10000 MPa.

19. The semiconductor device according to claim 16, wherein the second insulating layer comprises an insulating paste.

20. The semiconductor device according to claim 1, further comprising a plated layer including an outer edge portion formed in a region of the supporting member that surrounds a region with which the second insulating layer is held in contact, the outer edge portion reaching at least a part of outer sides of the supporting member.

21. The semiconductor device according to claim 20, wherein the outer edge portion is formed in a frame reaching all the outer sides of the supporting member.

22. The semiconductor device according to claim 20, wherein the supporting member is formed in a rectangle, and the outer edge portion includes parts that are held in contact with four corners of the supporting member, respectively, and spaced apart between the corners.

23. The semiconductor device according to claim 20, further comprising a suspending lead supporting the supporting member,
wherein the plated layer further includes a suspending lead portion formed on the suspending lead.

24. The semiconductor device according to claim 20, further comprising a plurality of leads and a plurality of wires connecting the plurality of leads to the semiconductor chip,
wherein the plated layer further includes a plurality of lead portions each formed at one of the plurality of leads in a region thereof including a part to which one of the wires is connected.

25. The semiconductor device according to claim 20, wherein the plated layer is made of Ag.

26. The semiconductor device according to claim 1, further comprising a first lead to which a positive voltage is applied, a second lead outputting a negative voltage, and a third lead to which a reference voltage is connected, these leads being connected to the semiconductor chip,
wherein the semiconductor chip includes a semiconductor substrate connected to the negative voltage.

27. The semiconductor device according to claim 1, further comprising a negative voltage generating unit for generating a negative voltage with respect to a reference potential.

28. The semiconductor device according to claim 27, constituted as a system power source for generating a plurality of positive voltages with respect to the reference potential.

29. The semiconductor device according to claim 7, further comprising: a plurality of leads each having a lower surface at least a part of which is exposed from the third insulating layer; and a plurality of bonding wires connecting the plurality of leads to the semiconductor chip.

30. The semiconductor device according to claim 29, wherein each of the plurality of leads includes a portion facing the supporting member, and said portion includes a lower surface covered by the third insulating layer.

31. The semiconductor device according to claim 1, wherein the supporting member is formed as an island, and the second insulating layer is higher in modulus of elasticity than the first insulating layer.

* * * * *